United States Patent
Iino

(10) Patent No.: US 6,315,970 B1
(45) Date of Patent: Nov. 13, 2001

(54) SEED CRYSTAL AND METHOD FOR PREPARING SINGLE CRYSTAL

(75) Inventor: Eiichi Iino, Annaka (JP)

(73) Assignee: Shin-Etsu Handotai Co., Ltd., Tokyo (JP)

( * ) Notice: Subject to any disclaimer, the term of this patent is extended or adjusted under 35 U.S.C. 154(b) by 0 days.

(21) Appl. No.: 09/509,456

(22) PCT Filed: Aug. 13, 1999

(86) PCT No.: PCT/JP99/04166

§ 371 Date: Mar. 29, 2000

§ 102(e) Date: Mar. 29, 2000

(87) PCT Pub. No.: WO00/08239

PCT Pub. Date: Feb. 17, 2000

(30) Foreign Application Priority Data

Aug. 7, 1998 (JP) .................................................. 10-236557

(51) Int. Cl.[7] .................................................. C01B 33/26
(52) U.S. Cl. ........................ 423/328.1; 117/13; 117/911
(58) Field of Search .......................... 423/328.1; 117/13, 117/911; 428/167, 446

(56) References Cited

U.S. PATENT DOCUMENTS 5,714,267  2/1998  Machida et al. .

FOREIGN PATENT DOCUMENTS

| 0 854 211 A1 | 7/1998 | (EP) . |
| A-8-290994 | 11/1996 | (JP) . |
| A-9-249492 | 9/1997 | (JP) . |
| A-10-203898 | 8/1998 | (JP) . |

*Primary Examiner*—Felisa Hiteshew
(74) *Attorney, Agent, or Firm*—Oliff & Berridge, PLC

(57) ABSTRACT

There is provided a seed crystal having a strength that the seed crystal is not broken even when the heavy single crystal is produced. The seed crystal is a seed crystal used for producing a single crystal according to Czochralski method wherein a relation between a sectional area of the seed crystal S ($mm^2$) and a weight W (kg) of the single crystal to be pulled is represented by the formula: S>W. The single crystal is produced using the seed crystal. Furthermore, the single crystal is pulled with conforming a sectional area S ($mm^2$) of a seed crystal and a weight W (kg) of a single crystal to be pulled to the formula: S>W.

13 Claims, 3 Drawing Sheets

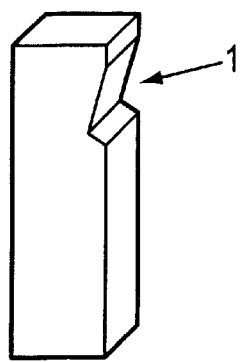
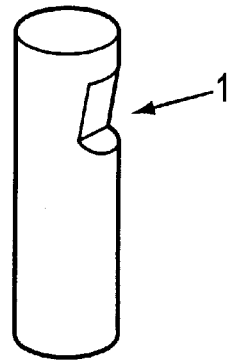
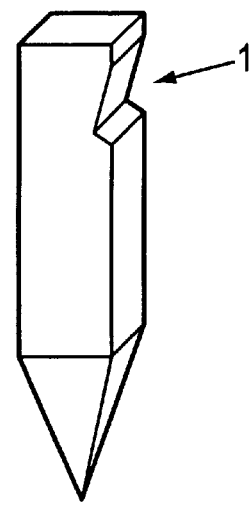
FIG. 2A
PRIOR ART
FIG. 2B
PRIOR ART
FIG. 2C
PRIOR ART

SEED CRYSTAL AND METHOD FOR PREPARING SINGLE CRYSTAL …

TECHNICAL FIELD

The present invention relates to an improvement of a seed crystal used in production of a silicon single crystal in accordance with Czochralski method (CZ method).

BACKGROUND ART

Conventionally, there is known for production of a single crystal, a pulling method called Czochralski method (CZ method) wherein a seed crystal is immersed in a melt of polycrystal raw material and is then pulled to grow a single crystal. In the method, a seed crystal held by a seed crystal holding jig needs to be strong enough to bear the weight of a grown crystal.

Recently, a single crystal, for example, CZ silicon single crystal has been getting heavier with increase in a diameter thereof. For such a tendency of increase in weight of the crystal, there have been proposed an improvement in resistance under load of the apparatus, a necking with a large diameter, or a new method substituted for a necking method, a method of holding a crystal mechanically or the like. However, strength of the crystal itself is one of important factors in common.

There have been various propositions as for a seed crystal and a seed crystal holding jig. For example, there is proposed in Japanese Patent Publication (kokoku) No. 5-36395 a seed crystal holding jig consisting of a body of a seed crystal holding jig with a taper, a piece for pressing a seed crystal and a ring for preventing the piece from dropping off. The seed crystal holding jig holds a seed crystal having a tapered cut to pull a single crystal. With such a structure, it is possible to hold a seed crystal without lowering strength of the seed crystal.

A seed crystal to be held by such a seed crystal holding jig is generally a prismatic seed crystal having a tapered cut 1 as shown in FIG. 2A, or a columnar seed crystal having a tapered cut 1 as shown in FIG. 2B. In order to pull the crystal without conducting necking, a seed crystal having a sharp tip end as shown in FIG. 2C can be used in some cases (See Japanese Patent Application No. 9-17687).

However, even when a seed crystal is held by the above-mentioned seed crystal holding jig, it is sometimes broken depending on a shape of a seed crystal or weight of a single crystal to be grown and pulled. Breakage of the seed crystal may lead to fall of the single crystal having a heavy weight in a melt in a crucible, which will be a serious accident, and is problematic. On the other hand, it is not desirable for production of a seed crystal and a necking process that a seed crystal is unnecessarily thick.

There has not been an appropriate standard for defining a shape such as a thickness of a seed crystal so far, and a seed crystal having a shape defined experientially has been used for producing a single crystal.

DISCLOSURE OF INVENTION

The present invention has been accomplished in order to solve the above-mentioned problems, and the main object of the present invention is to provide a seed crystal having a sufficient strength so that it may be surely prevented from being broken, even when a heavy single crystal is produced.

To achieve the above-mentioned object, the invention set forth in claims of the present application relates to a seed crystal used for producing a single crystal according to Czochralski method wherein a relation between a sectional area of the seed crystal S ($mm^2$) and a weight W (kg) of the single crystal to be pulled is represented by the formula: S>W.

As described above, when the seed crystal wherein a relation between a sectional area of the seed crystal S ($mm^2$) and a weight W (kg) of the single crystal to be pulled is represented by the formula: S>W is used, the seed crystal is never broken even in the case that a heavy single crystal is pulled, so that a silicon single crystal can be safely produced using a seed crystal having a minimum thickness.

In that case, a sectional area means a sectional area of a seed crystal at a section vertical to a pulling direction.

It is preferable that the above-mentioned seed crystal has a tapered cut on the side. In that case, the seed crystal can be held firmly, so that it can be held even if the single crystal to be pulled is heavy. Furthermore, strength of the seed crystal is not lowered so much, and therefore, there is no fear of breakage of the seed crystal.

In this case, it is preferable that an angle of the above-mentioned tapered cut is 3 to 15 degree. It is further preferable that a sectional area of the above-mentioned tapered cut is 25% or less of the sectional area S of a seed crystal.

If the angle is less than 3 degree, depth of the cut at which a seed crystal is held is too small, so that the seed crystal is held weakly. If the angle is more than 15 degree, sectional area of the seed crystal at a position where the cut is formed is too small, so that strength of the seed crystal is lowered, and there is caused a problem of strength of the seed crystal holding rig. In order to prevent strength of the seed crystal from being lowered as a result of too small sectional area of the seed crystal at a position where the cut is formed, a sectional area of the tapered cut is preferably 25% or less of the sectional area S of the seed crystal.

A sectional area of a cut means a maximum sectional area at a section vertical to the pulling direction of a portion removed from a seed crystal by cutting or the like in order to form a tapered cut on the seed crystal.

The present invention also relates to a seed crystal used for producing a single crystal according to Czochralski method wherein a relation between a minimum sectional area A ($mm^2$) of the seed crystal at a part where the seed crystal is held and a weight W (kg) of the single crystal to be pulled is represented by the formula: A>W.

As described above, if a relation between a minimum sectional area A ($mm^2$) of the seed crystal at a part where the seed crystal is held and a weight W (kg) of a crystal to be pulled is represented by the formula: A>W, the seed crystal is never broken at a part where it is held, so that a silicon single crystal can be safely pulled.

The minimum sectional area of the seed crystal at a part where the seed crystal is held means a minimum sectional area of a section of the part where the seed crystal is held by a holding jig or the like, which is vertical to the pulling direction of the seed crystal.

The above-mentioned seed crystal of the present invention can be silicon. The above-mentioned seed crystal can sufficiently cope with a recent tendency of a CZ silicon single crystal to be larger in diameter and be heavier.

In the method for producing a single crystal wherein the above-mentioned seed crystal is used, there is no fear of breakage of the seed crystal, so that a heavy single crystal can be safely produced. Especially, in the method wherein a single crystal is pulled according to Czochralski method with conforming a sectional area S (mm²) of a seed crystal and a weight W (kg) of a single crystal to be pulled to the formula: S>W, the single crystal can be safely pulled without breakage of the seed crystal, even when the heavy single crystal is pulled.

As described above, the seed crystal of the present invention enables the single crystal to be safely pulled without breakage of the seed crystal, in the case that it is pulled according to Czochralski method, even if the single crystal has a large diameter and is heavy.

BRIEF DESCRIPTION OF THE DRAWINGS

FIG. 1A is a schematic view of the prismatic seed crystal.

FIG. 1B shows an example wherein cuts are formed on two sides of the seed crystal.

FIG. 1C shows an example where a cut is formed at a corner of the seed crystal.

FIG. 1D shows a conic seed crystal, which is held at a side thereof.

FIGS. 2A to 2C are explanatory views showing examples of conventional seed crystals.

FIG. 2A is a schematic view of a prismatic seed crystal.

FIG. 2B is a schematic view of a columnar seed crystal.

FIG. 2C is a schematic view of a seed crystal having a sharp tip end.

BEST MODE FOR CARRYING OUT THE INVENTION

The present invention will now be described more in detail. However, the invention is not limited thereto.

The inventors of the present invention have conducted experiments and measurement as for a shape of a seed crystal that has been conventionally defined experientially, in order to find a surer basis for determining the shape, especially thickness of the seed crystal. Namely, tensile test of the seed crystal and measurement were actually conducted.

The tensile test was conducted by holding a seed crystal as a sample with a seed crystal holding jig, loading a tensile force thereto, and determining a load when the seed crystal as a sample is broken. As the seed crystal as a sample, a prismatic seed crystal having a tapered cut as shown in FIG. 2A was used, and the test was conducted with varying a sectional area S of the seed crystal. As a result, it has been found that a relation between a tensile strength F (kgf) of the seed crystal and a sectional area S (mm²) of the seed crystal was represented by the formula (1):

$$F \approx S \times 10 \qquad (1)$$

Accordingly, in the case that the weight of the crystal to be pulled is W (kg), if a sectional area S (mm²) of the seed crystal conforms to the following formula (2), the seed crystal is never broken.

$$10S > W \qquad (2)$$

However, the inventors of the present invention have studied to determine the value, taking safety factor of 10 times into consideration. If such a large safety factor is taken into consideration, it is possible to prevent breakage of a seed crystal almost completely. Namely, a single crystal can be pulled under the condition wherein the following formula (3) is fulfilled, with using a seed crystal wherein the following formula (3) is fulfilled.

$$S > W \qquad (3)$$

The inventors have further studied and found that the above-mentioned formula (3) representing a relation between a sectional area S of a seed crystal and a w eight W of a single crystal to be pulled can be applied not only to a prismatic seed crystal, but also to a columnar seed crystal as shown in FIG. 2B, a seed crystal having a sharp tip end as shown in FIG. 2C, and a polyhedral seed crystal as well. Even when a single crystal is pulled using such seed crystals, it is possible to prevent a seed crystal from being broken under the condition conforming to the formula (3).

A sectional area S (mm²) means a sectional area of the section vertical to a pulling direction, not only in the case that a seed crystal is in the shape of prism as mainly used in the test, but also in the case that it is in the above-mentioned shapes such as a column or the like. For example, if the shape of the crystal is a column having a diameter D (mm), a sectional area S is $\pi D^2/4$ (mm²).

The embodiment of the present invention will be described below. However, the invention is not limited thereto.

Figure 1A:
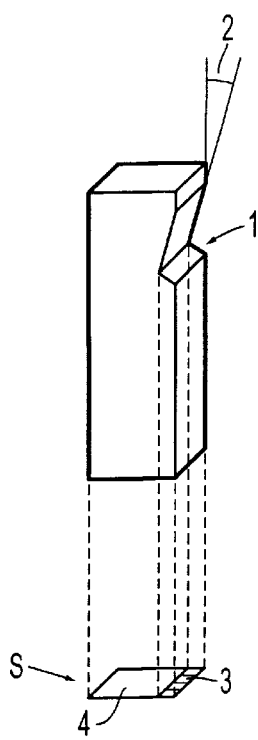
FIG. 1A–FIG. 1D are explanatory views of examples of the seed crystal of the present invention.

FIG. 1A shows a n example of a seed crystal of the present invention. The sectional area S (mm²) of the prismatic seed crystal is defined to conform to the condition of the formula (3), so that the crystal can be safely pulled.

The sectional area of the seed crystal that enables a crystal to be pulled safely can be calculated from the weight of the single crystal to be pulled and grown, according to the above-mentioned method. However, the seed crystal needs to have a cut for being held by a holding jig. The shape of the cut is preferably a tapered cut 1 formed on the side of the seed crystal for sure holding of the seed crystal. When a seed crystal is held by inserting a metal pin into a hole formed in the seed crystal crosswise, the strength of the seed crystal will be lowered. However, when the seed crystal is held at the surface of the above-mentioned tapered cut, strength of the seed crystal is not lowered so much, so that the seed crystal can be surely held.

Figure 1B:
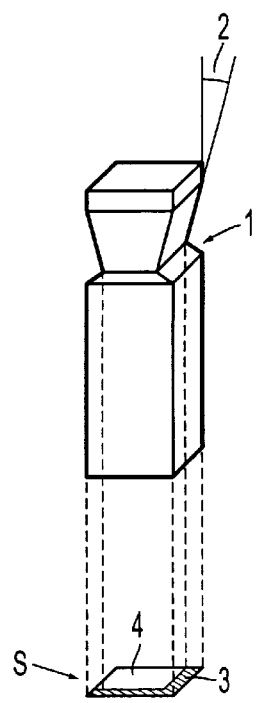

In FIG. 1A, the cut is formed on one side of the prismatic seed crystal. However, the cut 1 may be formed on two or more sides of the seed crystal as shown in FIG. 1B. Alternatively, the cut 1 may be formed at a corner of the seed crystal as shown in FIG. 1C.

The angle 2 of the tapered cut is preferably 3 to 15 degree. If the angle is in such a range, a depth of the cut, namely a sectional area 3 of the tapered cut is not so small that the seed crystal may be held weakly, and a sectional area 4 of the seed crystal at a position where the cut is formed is not so small that the strength of the seed crystal may be lowered. If the angle 2 of the cut is too large, the part with which the seed crystal holding jig is in contact will be so thin and so long that the strength against loading may be lowered, and the holding jig may be broken by the load. However, if the angle is in the above-mentioned range, such breakage of the holding jig is never caused.

Figure 1C:
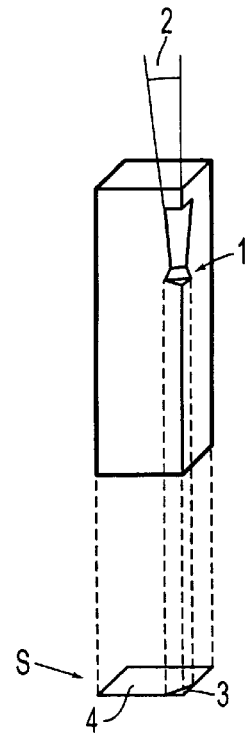

The appropriate angle 2 of the cut is applied not only to the seed crystals as shown in FIG. 1A, but also to the seed crystals as shown in FIG. 1B and FIG. 1C.

A sectional area 3 of the tapered cut is preferably 25% or lower of the sectional area S of the seed crystal, in order to prevent a sectional area 4 of the seed crystal at a part where a tapered cut is formed from being too small. When the ratio of the sectional area 3 of the cut to the sectional area S of the seed crystal is in the above range, the seed crystal can be held sufficiently firmly. Furthermore, decrease of the sectional area of the seed crystal due to formation of the cut does not matter, since a sufficient safety factor is taken into consideration in the formula (3) showing a condition of a sectional area S of the seed crystal and a weight W of a single crystal.

In addition to the above-mentioned condition, there may be set a condition that a relation between the minimum sectional area A (mm$^2$) of a part at which a seed crystal is held and a weight W (kg) of a single crystal to be pulled is represented by the formula: A>W.

The formula: A>W is a formula wherein the minimum sectional area A of a part at which a seed crystal is held is substituted for the sectional area S of the seed crystal in the formula (3). If the values conform to the relation, the single crystal can be pulled safely without breakage of the part at which the seed crystal is held by the holding jig or the like.

Figure 1D:
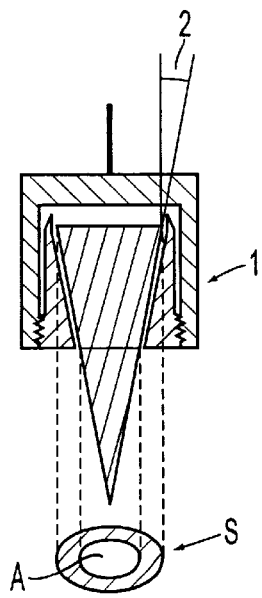

For example, in the case that the side of the conic seed crystal is held with a holding jig as shown in FIG. 1D, if a minimum sectional area A of the part at which a seed crystal is held with a holding jig as shown in FIG. 1D and weight W of a single crystal to be pulled conform to the formula: A>W, the single crystal can be pulled safely.

Of course, the conditions of the seed crystal of the present invention can be applied not only to the seed crystals shown in FIG. 1A to FIG. 1D but also to a columnar seed crystal, a seed crystal having a sharp tip end, a polyhedral seed crystal or the like.

The material of the seed crystal of the present invention is not limited, however, if the seed crystal is made of silicon, a semiconductor silicon single crystal which tends to have a large diameter and be heavy especially recently, can be safely produced by a pulling method. In that case, the seed crystal does not need to be unnecessarily thick, so that necking or the like can be conducted easily and a seed crystal can be produced easily. Furthermore, cost can be minimized.

When the single crystal is produced by using a seed crystal of the present invention, the heavy single crystal having a large diameter can be produced safely. Furthermore, the method of the present invention wherein a single crystal is pulled with conforming a sectional area S (mm$^2$) of a seed crystal and a weight W (kg) of the single crystal to be pulled to the formula: S>W can be applied to any cases wherein a single crystal is pulled according to a Czochralski method, to secure an operation for pulling a single crystal.

The embodiments of the present invention will be explained below with examples. However, the present invention is not limited thereto.

EXAMPLE, COMPARATIVE EXAMPLE

Supposing production of a silicon single crystal having a diameter of 200 mm and a weight of 100 kg by pulling a regular quadrangular prismatic silicon seed crystal shown in FIG. 1A according to a Czochralski method, tensile strength test of the seed crystal was conducted. The tensile test was conducted by holding a seed crystal as a sample with a seed crystal holding jig, loading a tensile force thereto, and determining a load when the seed crystal as a sample was broken. The tensile strength test was conducted with varying length of a side of the regular quadrangular prismatic seed crystal as a sample, namely a sectional area S of the seed crystal, and a breaking load (kgf) when the seed crystal was broken was determined. An angle of a tapered cut of the seed crystal was 8 degree, and a sectional area of the cut was 15% of the sectional area S of the seed crystal.

Figure 3:
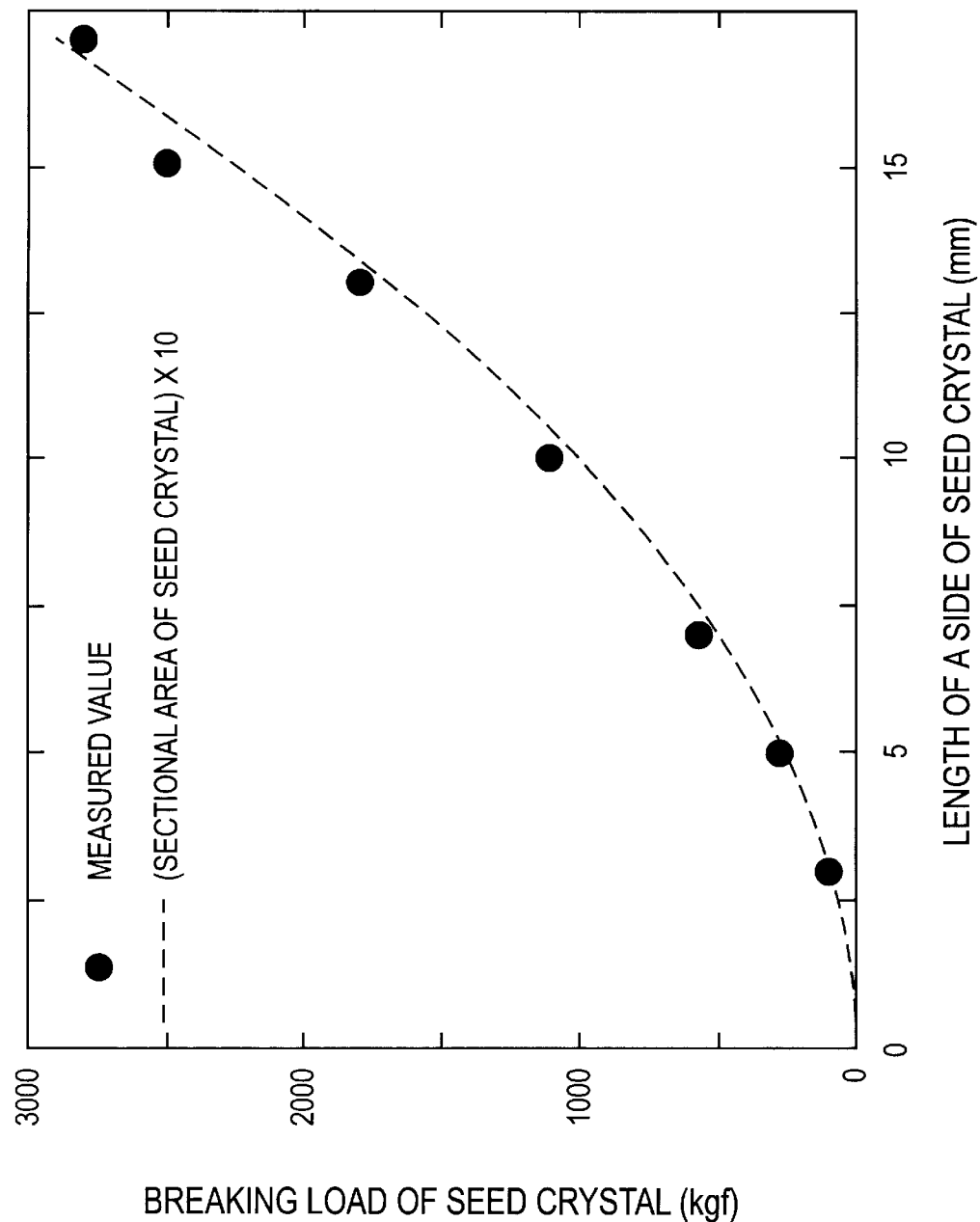
FIG. 3 is a graph showing a relation between a length (mm) of a side of a regular quadrangular prismatic seed crystal and a breaking point of weight (kgf) of the seed crystal.

The results were shown in FIG. 3.

FIG. 3 shows a relation between a side length (mm) of the seed crystal and a breaking load (kgf) of the seed crystal. Black circle plots show actually measured values. A dashed line shows a breaking load of the seed crystal calculated using a formula (1) from the sectional area S calculated from a side length of the seed crystal.

As shown in FIG. 3, it was found that actual measured values conformed to the formula (1). Accordingly, when a side length of a seed crystal that a sectional area S (mm$^2$) of the seed crystal is more than a weight W (kg) of the single crystal to be pulled, is more than 10 mm, tensile strength of the seed crystal is more than 1000 kgf, which is 10 times or more of the weight of the single crystal to be pulled, and therefore, the single crystal can be sufficiently safely pulled by using the seed crystal having the sectional area.

A silicon single crystal having a diameter of 300 mm and a weight of 150 kg was pulled and produced according to Czochralski method using the seed crystal having a side length of the seed crystal of 13 mm, namely the seed crystal having a sectional area S of the seed crystal of 169 mm$^2$, used as a sample in the above-mentioned test. 100 single crystals could be safely produced by a pulling method without causing any breakage of the seed crystal or the like.

The present invention is not limited to the above-described embodiment. The above-described embodiment is a mere example, and those having the substantially same structure as that described in the appended claims and providing the similar action and effects are included in the scope of the present invention.

Moreover, the czochralski method in the present invention include mcz method (magnetic field applied Czochralski crystal growth method) in which magnetic field is applied when the single crystal is pulled.

What is claimed is:

1. A seed crystal used for producing a single crystal according to Czochralski method wherein a relation between a minimum sectional area A (mm$^2$) of a seed crystal at a part where the seed crystal is held and a weight W (kg) of the single crystal to be pulled is represented by the formula: A>W.

2. The seed crystal according to claim 1 wherein a tapered cut is formed on the side of said seed crystal.

3. The seed crystal according to claim 2 wherein an angle of said tapered cut is 3 to 15 degree.

4. The seed crystal according to claim 3 wherein a sectional area of said tapered cut is 25% or less of a sectional area S of the seed crystal.

5. A method for producing a single crystal according to Czochralski method comprising:
   forming a melt of polycrystal raw material;
   immersing the seed crystal according to claim 4 into the melt of polycrystal raw material; and
   pulling the seed crystal to grow the single crystal.

6. A method for producing a single crystal according to Czochralski method comprising:
   forming a melt of polycrystal raw material;
   immersing the seed crystal according to claim 3 into the melt of polycrystal raw material; and
   pulling the seed crystal to grow the single crystal.

7. The seed crystal according to claim 2 wherein a sectional area of said tapered cut is 25% or less of a sectional area S of the seed crystal.

8. A method for producing a single crystal according to Czochralski method comprising:
  forming a melt of polycrystal raw material;
  immersing the seed crystal according to claim 7 into the melt of polycrystal raw material; and
  pulling the seed crystal to grow the single crystal.

9. A method for producing a single crystal according to Czochralski method comprising:
  forming a melt of polycrystal raw material;
  immersing the seed crystal according to claim 2 into the melt of polycrystal raw material; and
  pulling the seed crystal to grow the single crystal.

10. A method for producing a single crystal according to Czochralski method comprising:
  forming a melt of polycrystal raw material;
  immersing the seed crystal according to claim 1 into the melt of polycrystal raw material; and
  pulling the seed crystal to grow the single crystal.

11. The seed crystal according to claim 6 wherein said seed crystal is silicon.

12. A method for producing a single crystal according to Czochralski method comprising:
  forming a melt of polycrystal raw material;
  immersing the seed crystal according to claim 11 into the melt of polycrystal raw material; and
  pulling the seed crystal to grow the single crystal.

13. A method of pulling a single crystal wherein a single crystal is pulled according to Czochralski method with conforming a minimum sectional area A (mm$^2$) of a seed crystal at a part where the seed crystal is held and a weight W (kg) of a single crystal to be pulled to the formula A>W.

* * * * *